(12) United States Patent
Park

(10) Patent No.: US 7,922,380 B2
(45) Date of Patent: Apr. 12, 2011

(54) LIGHT UNIT AND DISPLAY DEVICE HAVING THE SAME

(75) Inventor: Dong Wook Park, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 93 days.

(21) Appl. No.: 12/265,519

(22) Filed: Nov. 5, 2008

(65) Prior Publication Data

US 2009/0116262 A1    May 7, 2009

(30) Foreign Application Priority Data

Nov. 6, 2007  (KR) .................. 10-2007-0112553

(51) Int. Cl.
*F21V 7/04* (2006.01)
(52) U.S. Cl. .................. 362/631; 362/612; 362/623
(58) Field of Classification Search .................. 362/294, 362/373, 320, 612, 623, 630–631
See application file for complete search history.

(56) References Cited

U.S. PATENT DOCUMENTS

| | | | | |
|---|---|---|---|---|
| 5,030,799 A * | 7/1991 | Fukuta | ............................ | 174/250 |
| 5,397,867 A * | 3/1995 | Demeo | ............................ | 200/5 A |
| 5,785,418 A * | 7/1998 | Hochstein | .................... | 362/373 |
| 6,697,130 B2 * | 2/2004 | Weindorf et al. | ............... | 349/65 |
| 6,862,053 B2 * | 3/2005 | Lee et al. | ............................ | 349/58 |
| 7,131,750 B2 * | 11/2006 | Liu et al. | ............................ | 362/327 |
| 7,270,464 B2 * | 9/2007 | Nakayoshi et al. | ........... | 362/613 |
| 7,530,723 B2 * | 5/2009 | Ohno | ............................ | 362/613 |
| 2004/0263716 A1 * | 12/2004 | Lee et al. | ............................ | 349/61 |
| 2005/0254258 A1 * | 11/2005 | Lee | ............................ | 362/612 |
| 2005/0259442 A1 * | 11/2005 | Sakurai | ............................ | 362/618 |
| 2006/0114694 A1 * | 6/2006 | Cho et al. | ............................ | 362/631 |
| 2006/0152647 A1 * | 7/2006 | Han et al. | ............................ | 349/58 |
| 2006/0268551 A1 * | 11/2006 | Mok et al. | ............................ | 362/294 |
| 2007/0097710 A1 * | 5/2007 | Chang et al. | ............................ | 362/623 |
| 2007/0139961 A1 * | 6/2007 | Cheah et al. | ............................ | 362/612 |
| 2007/0147074 A1 * | 6/2007 | Sakai et al. | ............................ | 362/608 |
| 2007/0195551 A1 * | 8/2007 | Shin | ............................ | 362/612 |

* cited by examiner

*Primary Examiner* — Julie A Shallenberger
(74) *Attorney, Agent, or Firm* — Birch, Stewart, Kolasch & Birch, LLP

(57) ABSTRACT

Provided are a light unit and a display device having the same. The light unit comprises a light guide member, a board, and a light-emitting module. The light guide member outputs surface tight upward. The light-emitting module comprises the board where a light-emitting devices disposed and a metal plate on a rear surface of the board.

18 Claims, 3 Drawing Sheets

LIGHT UNIT AND DISPLAY DEVICE HAVING THE SAME

CROSS-REFERENCE TO RELATED APPLICATIONS

The present application claims priority under 35 U.S.C. §119 to Korean Patent Application No. 10-2007-0112553 (filed on Nov. 6, 2007), which is hereby incorporated by reference in its entirety.

BACKGROUND

Embodiments relate to a light unit and a display device having the same.

A variety of display devices such as a cathode ray tube (CRT), a liquid crystal display device (LCD) using electro-optical effect, a plasma display panel (PDP) using gas discharge, and an electro-luminescence display (ELD) using electric field light emission effect are generally used currently. Among them, studies have been actively conducted on the LCD device.

The LCD device is being widely used as a monitor of a laptop computer, a desktop computer and a large information display device in nowadays.

The LCD device is a passive-type display device that displays an image by adjusting an amount of external light. Therefore, light is irradiated onto the LCD panel using a backlight unit.

SUMMARY

Embodiments provide a light unit and a display device having the same, which provide a light-emitting module with improved heat conduction properties.

Embodiments also provide a light unit and a display device having the same, which allow a metal plate to be integrally attached to a board with a light-emitting device mounted at a side of a light guide member.

An embodiment provides a light unit comprising: a light guide member outputting surface light upward; a light-emitting module comprising a board where a light-emitting devices are disposed and a metal plate on a rear surface of the board.

An embodiment provides a display device comprising: a light guide member outputting surface light upward; a light-emitting module comprising a flexible board where a light-emitting devices disposed and a metal plate on a rear surface of the board; a housing comprising the light guide member and the light-emitting module; and a liquid crystal panel on the light guide member.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

Figure 1:
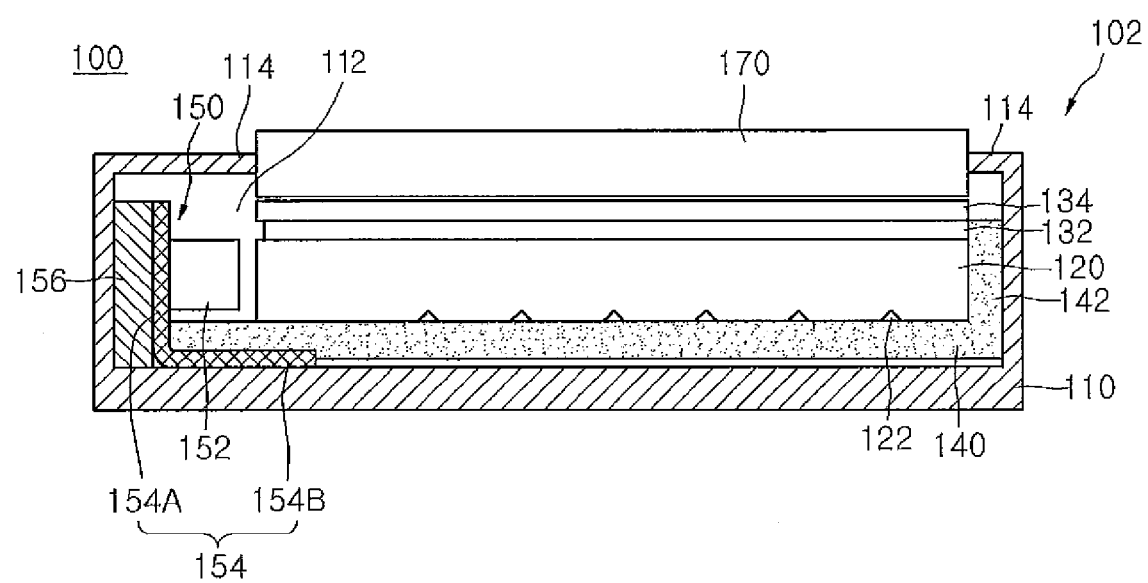
FIG. 1 is a side sectional view of a display device according to an embodiment.

FIG. 1 is a side sectional view of a display device in accordance with an embodiment.

Referring to FIG. 1, a display device 100 comprises a housing 110, a light guide member 120, a diffusion sheet 132, a prism sheet 134, a reflection sheet 140, a light-emitting module 150, and a liquid crystal panel 170. A light unit 102 comprises the housing 110, the light guide member 120, the diffusion sheet 132, the prism sheet 134, the reflection sheet 140, and the light-emitting module 150.

The housing 110 may be made of a metal with excellent heat dissipation characteristic, e.g., aluminum or stainless steel. The housing 110 is opened upward to form a space 112, and a light shielding cover 114 is placed on top of the housing 110 such that it extends inward from an outer contour of the housing 110. The light-shielding cover 114 prevents light from leaking out of the housing 110.

The reflection sheet 140, the light guide member 120, the diffusion sheet 132, and the prism sheet 134 are sequentially stacked on a bottom surface of the housing.

The reflection sheet 140 may be disposed on a rear surface of the light guide member 120, or may be disposed on a rear surface and another side of the light guide member 120.

The reflection sheet 140 reflects light leaking downward through the light guide member 120 toward the liquid crystal panel. In addition, the other side 142 of the reflection sheet 140 is bent in a direction of the other side of the light guide member 120, which makes it possible to reflect light leaking to the other side of the light guide member 120.

The display device may not comprise the reflection sheet 140, and the bottom surface of the housing 110 may be coated with light reflective materials.

The light guide member 120 is a light guide panel (LGP), and reflection patterns can be formed in the rear surface of the LGP. The light guide member 120 guides light incident on one side thereof, and the reflection patterns 122 reflect the light guided by the light guide member 120 toward the liquid crystal panel. Here, surface light is irradiated onto a top surface of the light guide member 120.

At least one of optical sheets, e.g., the diffusion sheet 132, the prism sheet 134, or a brightness enhancement sheet may be disposed on the light guide member 120.

The diffusion sheet 132 is disposed on the light guide member 120, and allows the incident light to diffuse. The prism sheet 134 may comprise a horizontal prism sheet or/and a vertical prism sheet, or a brightness enhancement sheet. The light diffused by the diffusion sheet 132 is condensed into the light-emitting region.

The light-emitting module 150 comprises light-emitting devices 152, a board 154, and a metal plate 156.

The light-emitting devices 152 may comprise at least one of a red LED, a green LED, a blue LED, and a white LED, but is not limited thereto. The light-emitting devices 152 are mounted on a front surface of the board 154 at regular intervals, and correspond to one side of the light guide member 120. Accordingly, the light-emitting devices 152 can emit colored light such as red light, green light and blue light, or emit white light.

The board 154 may comprise a flexible printed circuit board (PCB), and may be divided into an upper portion 154A and a lower portion 154B which are bent at a predetermined angle. The LED 152 is disposed on the front surface of the upper portion 154A, and the lower portion 154B is disposed under the reflection sheet 140.

The metal plate 156 is attached to the rear surface of the board 154, and releases heat generated from the LED 152 and the board 154. The metal plate 156 has a bar shape, and may be formed smaller or greater than an area of the light-emitting devices 152.

One side of the metal plate 156 is integrally attached to the rear surface of the upper portion 154A of the board 154, and the other side is in contact with the side surface of the housing 110. The metal plate 156 and the housing 110 release heat generated from the light-emitting devices 152.

The liquid crystal panel 170 is disposed over the prism sheet 134, and displays data using the light emitted through the prism sheet 134. A polarizer (not shown) may be attached to the liquid crystal panel 170, but is not limited thereto.

Figure 2:
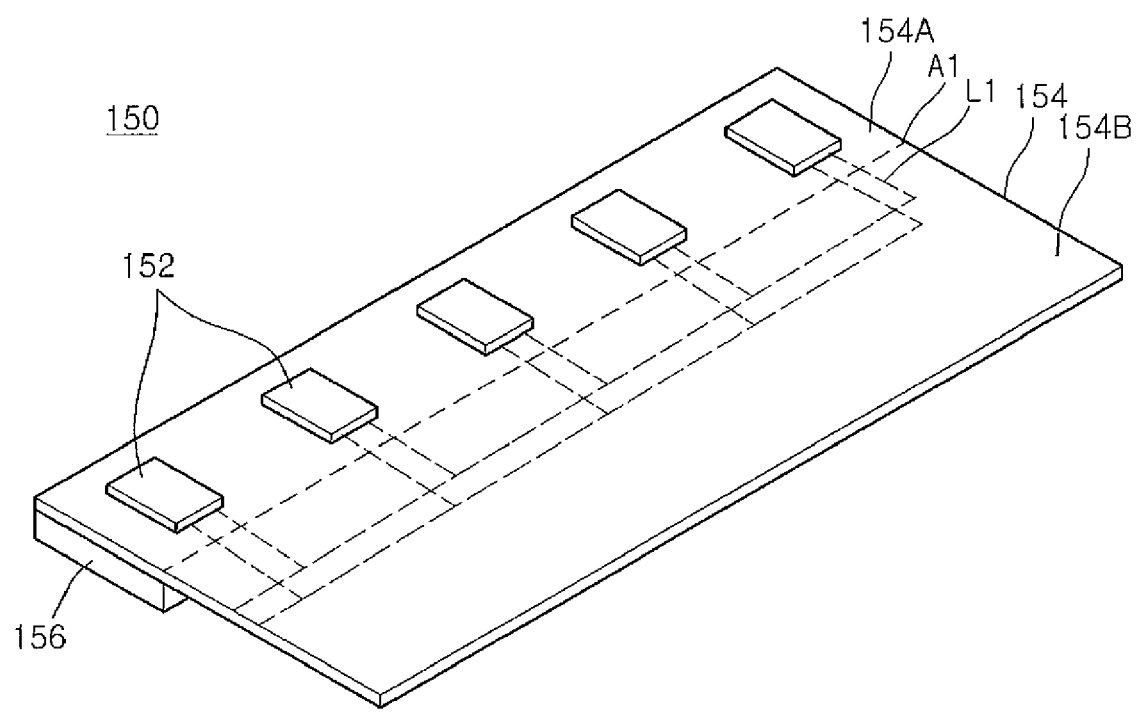
FIG. 2 is a perspective view of a light-emitting module in FIG. 1.

FIG. 2 is a perspective view of a light-emitting module in FIG. 1.

Referring to FIG. 2, the board 154 is divided into the upper portion 154A and the lower portion 154B. The light-emitting devices 152 are mounted on the front surface of the upper region 154A, and the metal plate 156 is attached to the rear surface of the upper portion 154A. The lower portion 154B is disposed on the bottom surface of the housing (see 110 of FIG. 1). Various kinds of line patterns are formed on the lower portion 154B so as to drive the light-emitting devices 152.

Here, the line pattern, which is a circuit pattern for driving the light-emitting devices 152, comprises a power line, a ground line, a plurality of driving lines L1 connected to the respective light-emitting devices 152.

Also, the line pattern of the upper portion 154A of the board 154 may be connected to the lower portion 154B through a minimum line. That is, it is possible to form a line required for driving each light-emitting device 152.

In the board 154, the flexible PCB can be thinner, and thermal characteristics can be enhanced, by separating the lower portion 154B where the circuit patterns are formed and the upper portion 154A where the light-emitting devices 152 are mounted.

A boundary portion A1 between the upper portion 154A and the lower portion 154B of the board 154 are formed thinner than other portions, thus allowing the board 154 to be bent easily.

White ink (White PSR ink) is printed on the front surface of the board 154, i.e., the upper portion 154A where the light-emitting devices 152 are mounted, so that light of the light-emitting device 152 can be reflected.

The metal plate 156 is integrally attached to the rear surface of the upper portion 154A of the board 154. The metal plate 156 may be made of a material with good heat dissipation characteristics, e.g., aluminum in a bar shape, and can be integrally attached to the rear surface of the upper portion 154A of the board 154 by a pressing process for heating and pressurization. The metal plate 156 releases heat generated from the board 154, and transfers the heat to the housing 110.

Figure 3:
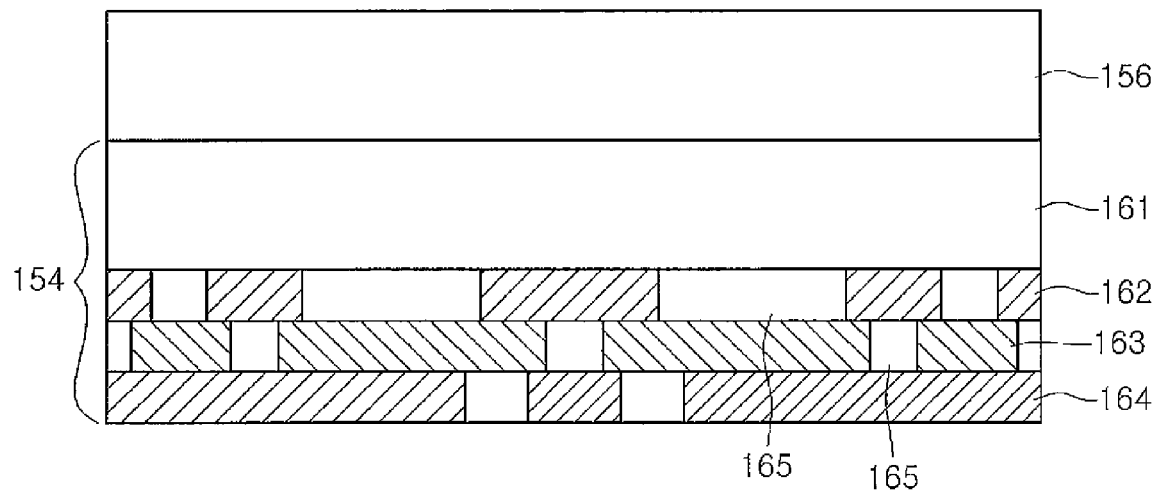
FIG. 3 is a detailed sectional view of a board in FIG. 1.

FIG. 3 is a detailed sectional view of the board 154 in FIG. 1.

Referring to FIG. 3, the board 154 is a flexible PCB, and the flexible board 154 comprises a top coverlay 162, a copper foil layer 163, and a bottom coverlay 164. A plurality of dummy patterns 165 are formed in the top coverlay 162 and the bottom coverlay 164. Accordingly, heat conduction properties can be improved in a top and/or bottom direction of the flexible board 154.

The copper foil 163 is attached to rear surface of the top coverlay 162 through heating and pressurization using a heat press, and the copper foil 163 is then patterned into a desired circuit pattern. After the top coverlay 162, the copper foil 163 and the bottom coverlay 164 are positioned, they are integrally formed through pressurization and heating using a heat press.

The metal plate 156 is attached to the flexible board 154. The attaching of the metal plate 156 comprises: placing an epoxy prepreg 161 on the flexible board 154; placing the metal plate 156 of the prepreg 161; and integrally forming the prepreg 161 and the metal plate 156 by heating and pressurizing them using a heat press. Here, the prepreg 161, which is made of an epoxy containing a ceramic filter, can have an insulation function and reinforcement function. The metal plate 156 is integrally attached to the rear surface of the flexible board 154, thus improving heat dissipation characteristics.

In the description of embodiments, it will be understood that when a layer (or film), region, pattern or structure is referred to as being 'on' another layer (or film), region, pad or pattern, the terminology of 'on' and 'under' comprises both the meanings of 'directly on/under' and 'indirectly on/under'. Further, the reference about 'on' and 'under' each layer will be made on the basis of drawings. Also, the thickness of each layer in the drawings is an example, and is not limited thereto.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light unit comprising:
   a light guide member outputting surface light upward;
   a board disposed to a first side of the light guide member;
   a plurality of light-emitting devices mounted on a first side of the board;
   a reflection sheet under the light guide member;
   a housing receiving the light guide member, the light-emitting devices, the board, and the reflection sheet; and
   a metal plate attached to a second side of the board and a first side of the housing,
   wherein the second side of the board is opposite to the first side of the board,
   wherein a lower side of the metal plate is contacted with a bottom surface of the housing,
   wherein the board is a flexible PCB that includes a first portion disposed between the metal plate and the first side of the light guide member, and a second portion disposed between the reflection sheet and the housing, and
   wherein the second portion of the board includes line patterns connected to the light-emitting devices.

2. The light unit according to claim 1, wherein the housing is made of a metal material.

3. The light unit according to claim 1, wherein a first portion of the reflection sheet extends to a second side of the light guide member which is opposite to the first side of the light guide member, and wherein the reflection sheet is physically separate from the housing.

4. The light unit according to claim 2, wherein a second side of the metal plate is in contact with the first side of the housing.

5. The light unit according to claim 1, wherein the board is a flexible PCB, and wherein the metal plate is attached to the second side of the board by a prepreg.

6. The light unit according to claim 1, wherein the plurality of light-emitting devices are arranged by regular intervals, the light-emitting devices comprising at least one of a white LED, a green LED, a blue LED, and a red LED.

7. The light unit according to claim 1, comprising at least one of a prism sheet, a diffusion sheet, and a brightness enhancement sheet on the light guide member.

8. The light unit according to claim 1, wherein the second portion of the board includes a power line, a ground line, and a plurality of driving lines.

9. The light unit according to claim 1, wherein the board comprises a top coverlay and a bottom coverlay comprising a plurality of dummy patterns, a copper foil layer between the top coverlay and the bottom coverlay.

10. The light unit according to claim 1, wherein the first side of the board is printed as a white ink.

11. The light unit according to claim 1, wherein the light guide member comprises a reflection patterns.

12. A light unit comprising:
a light guide member;
a board disposed to a first side of the light guide member;
a plurality of light-emitting devices mounted on a first side of the board;
a reflection sheet under the light guide member;
a housing receiving the light guide member, the light-emitting devices, the board, and the reflection sheet; and
a metal plate attached to a second side of the board and a first side of the housing, wherein the second side of the board is opposite to the first side of the board, wherein a first portion of the reflection sheet is extended to a second side of the light guide member which is opposite to the first side of the light guide member, wherein the reflection sheet is physically separated from the housing, and wherein the board includes a first portion in contact with an entire first side of the metal plate, and a second portion extended between the reflection sheet and the housing.

13. The light unit according to claim 12, wherein the housing includes a light shielding cover disposed on top of the housing and extended inward from an outer contour of the housing.

14. The light unit according to claim 13, wherein the second portion of the board includes line patterns connected to the light-emitting devices which are disposed to the first portion of the board.

15. The light unit according to claim 13, wherein the housing comprises a metal material of stainless steel or aluminum.

16. The light unit according to claim 12, wherein a height of the metal plate is more than a height of the board from the bottom surface of the housing.

17. The light unit according to claim 12, comprising a prepreg disposed between the second side of the board and a first side of the metal plate.

18. The light unit according to claim 13, wherein the second portion of the board extends below the light-emitting devices.

* * * * *